(12) United States Patent
Campbell et al.

(10) Patent No.: US 7,887,277 B2
(45) Date of Patent: Feb. 15, 2011

(54) RETICLE STORAGE POD (RSP) TRANSPORT SYSTEM UTILIZING FOUP ADAPTER PLATE

(75) Inventors: Philip L. Campbell, Millbrook, NY (US); David J. Pinckney, Newtown, CT (US); Edward Sherwood, Wingdale, NY (US); Uldis A. Ziemins, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/537,649

(22) Filed: Aug. 7, 2009

(65) Prior Publication Data

US 2009/0297299 A1     Dec. 3, 2009

Related U.S. Application Data

(63) Continuation of application No. 11/306,708, filed on Jan. 9, 2006, now Pat. No. 7,591,624.

(51) Int. Cl.
*H01L 21/677* (2006.01)
(52) U.S. Cl. ............... 414/217; 414/217.1; 414/416.08; 414/940
(58) Field of Classification Search ................. 414/217, 414/217.1, 416.08, 940
See application file for complete search history.

(56) References Cited

U.S. PATENT DOCUMENTS

| | | | |
|---|---|---|---|
| 5,536,128 A * | 7/1996 | Shimoyashiro et al. | ..... 414/273 |
| 6,095,335 A | 8/2000 | Busby | |
| 6,165,268 A | 12/2000 | Ow et al. | |
| 6,619,903 B2 | 9/2003 | Friedman et al. | |
| 6,655,898 B1 | 12/2003 | Liu-Barba et al. | |
| 6,663,340 B1 | 12/2003 | Zeakes et al. | |
| 7,243,003 B2 * | 7/2007 | Rice et al. | .................. 700/245 |
| 7,318,697 B2 * | 1/2008 | Wu et al. | ..................... 414/412 |
| 7,328,836 B2 * | 2/2008 | Hsueh et al. | ................. 235/375 |
| 2003/0040841 A1 * | 2/2003 | Nasr et al. | ................... 700/245 |
| 2003/0161714 A1 * | 8/2003 | Blattner et al. | .............. 414/935 |
| 2003/0198540 A1 * | 10/2003 | Lin et al. | ..................... 414/217 |
| 2004/0017556 A1 * | 1/2004 | Nakahara | ..................... 355/70 |
| 2004/0052624 A1 * | 3/2004 | Miyano et al. | .............. 414/498 |
| 2006/0038682 A1 * | 2/2006 | Reyes et al. | .............. 340/572.1 |
| 2006/0078407 A1 * | 4/2006 | del Puerto et al. | ........... 414/217 |
| 2007/0128010 A1 | 6/2007 | Gifford et al. | |
| 2007/0284217 A1 | 12/2007 | Ito | |

FOREIGN PATENT DOCUMENTS

| JP | 2000091401 | * | 3/2000 |
|---|---|---|---|
| JP | 2003110000 | * | 11/2003 |

* cited by examiner

*Primary Examiner*—Michael S Lowe
(74) *Attorney, Agent, or Firm*—Scully, Scott, Murphy & Presser, P.C.; Ian MacKlnnon, Esq.

(57) ABSTRACT

A combination of a FOUP (front opening unified pod) system and a reticle system utilized for the transport of wafers and a reticle system, the latter of which are used for transporting reticles from a first fabrication site to a further site at another location, and which provides for a unified system enabling the automated and trackable delivery of the reticles between these sites. Provided is a modified FOUP base structure, which is adapted to retain a reticle and to be able to employ existing equipment in a fabrication site which only necessitates a minimal modification of the equipment in order to render the latter universally adaptable to the combination of the systems.

12 Claims, 7 Drawing Sheets

RSP TOP FLANGE

TRANSPORT VIA RSP FOUP

RETICLE STORAGE POD (RSP) TRANSPORT SYSTEM UTILIZING FOUP ADAPTER PLATE

This application is a continuation of U.S. patent application Ser. No. 11/306,708, filed Jan. 9, 2006.

BACKGROUND

The present invention relates to the unique combining of a FOUP (front opening unified pod) system utilized for the transport of wafers and a reticle system, the latter of which are used for transporting reticles from a first fabrication site to a further site at another location, and which provides for a unified system enabling the automated and trackable delivery of the reticles between these sites.

In particular, the invention is directed to the provision of a unique modified FOUP base structure, which is adapted to retain a Reticle Storage Pod (RSP) and to be able to employ existing material transport equipment in a fabrication site which only necessitates a minimal modification of the equipment in order to render the latter universally adaptable to the combination of the systems.

In essence, the utilization of Reticle Storage Pods (RSPs) is well known in the technology, wherein RSP carriers are conveyed on OHT (Overhead Transport) vehicles or conveyor tracks. Similarly, currently existing FOUP (front opening unified pod) Automated Material Handling Systems (AMHS) are employed in a generally segregated mode from the RPS carriers and, in effect, are designed for an independent operation, which is not coordinated therewith. Consequently, it is intended, by means of the present invention, to provide a unique combination of such normally unrelated systems, which combine the capabilities of automated RSP carriers or transports with currently existing FOUP AMH systems.

At this time, currently existing fabrication automated systems handle FOUPs and RSP carriers on essentially the same OHT (Overhead Transport) vehicles or tracks in a separate and basically uncoordinated manner. As a consequence, semiconductor fabrication is burdened with the addition of extensive structural and functional requirements needed to move reticles supporting wafers being processed to diverse areas or new fabrication regions, whereby such requirements may be prohibitive in nature. Moreover, although manual transportation of the wafers and reticles is an option, this mode of operation is slow in functioning, and may, at times, result in excessive breakage and loss of reticles. Furthermore, an automated delivery of the components to other fabrication locations or additions to existing fabrication sites requires the provision of an automated and readily trackable system, which is suited for the transport and controlling of the reticles being conveyed between those sites or locations.

It is also important to be able to uniquely combine RSP transportation with preexisting or currently employed FOUPs, the latter of which are equipped with an RSP adapter assembly and whereby any FOUP could retain a plurality of RSPs through a concept of utilization of a wafer adaptation plate, which retains the RSPs, and which can be employed in conjunctive operation with end effectors and most robotic installations utilized currently in the technology.

Presently, no combination of such RSP transport systems and FOUP AMHS systems are known to be available, and these systems are ordinarily employed as independent and autonomously functioning installations in various semiconductor processing and fabrication locales or sites.

Liu-Barba, et al., U.S. Pat. No. 6,655,898 B1, discloses an arrangement for the cycling of FOUPs (front opening unified pods). The publication is directed to an essentially stand-alone apparatus, which cycles FOUPs, hoisting the latter up and down and levering a counterbalance relationship between two FOUPs which are involved in this process. This has nothing in common with providing a Reticle Storage Pod (RSP) arrangement, which is adapted to be combined with a FOUP transport system, as disclosed by the present invention.

Blattner, et al., U.S. Patent Publication No. 2003/0161714 A1, does not disclose an inter-building reticle transport arrangement and is primarily directed to the provision of a storage and buffer system with transport elements, which do not in any manner combine the normally diverse transport systems for RSPs and FOUPs in a manner analogous to that of the present invention.

Ow, et al., U.S. Pat. No. 6,165,268, discloses a method of providing modifications for facilitating 200-millimeter wafer cassettes adapted to be mounted for processing on a 300-millimeter wafer FOUP load port. Provided in the disclosed apparatus is an adapter fixture, which is placed on a 300 millimeter load port kinematic loading pins and an open 200 millimeter wafer cassette is adapted to be positioned thereon. To the contrary, the present invention describes a method and apparatus for adapting a 300-millimeter wafer transport system to transport reticles (RSPs) in a combined arrangement therewith.

Busby, U.S. Pat. No. 6,095,335, discloses an apparatus within a FOUP arrangement adapted to accommodate differently sized wafers, such as positioning 200-millimeter wafers inside a 300-millimeter FOUP through a size conversion capability. This has nothing in common with the adaptation of a conveyer system to combine transport Reticle Storage Pods (RSPs) and FOUP transport systems for operation on a common transport arrangement intended to extend between different fabrication facilities and processing sites.

BRIEF SUMMARY

Accordingly, pursuant to the invention, there is provided a novel and unique combined or composite transportation system, which, in a reliable manner, imparts an automated RSP (Storage Pod) transport capability to an existing FOUP (front opening unified pod) Automated Material Handling System (AMHS). This is effected in that in a simple and inexpensive mode, it is possible to impart diverse capabilities to both transportation systems through the combination thereof in conveying reticles containing semiconductor wafers from one fabrication facility to a second facility or building locale, and wherein there is only required essentially a modified FOUP handling flange structure, and wherein, pursuant to a further modification, multiple RSPs can be transported in a FOUP.

In order to achieve the foregoing novel aspects, pursuant to the invention there is provided a single or unitary track transport or conveying system for overhead transport vehicles (OHT) or tracks, which is capable of handling both FOUPs and RSP carriers through the feature in that currently existing FOUPs are equipped with an RSP adapter assembly. Pursuant to the invention, the assembly, which adapts the RSPs to FOUPs, thereby implementing the combined transport capability, can be readily installed in any FOUP, and may hold a plurality, preferably up to three RSPs, which are employed in transporting semiconductor wafers. Hereby, a suitable adapter, which is installed in connection with the FOUPs, may be of the same size as that for a 300 millimeter wafer, possessing three locating kinematic mount pins in order to simulate a load port, and whereby up to three RSPs can be simultaneously transported by a FOUP to any particular location or site within a transport region or processing areas, such as between various fabrication buildings.

Moreover, pursuant to the present invention, an adapter of customized construction may be provided, whereby the adapter is mounted inside a FOUP so as to also enable the latter to hold three RSPs. Concurrently, end effectors and robots are presently available whereby FOUPs are handled in connection with the RSPs, and can be readily adapted in a novel and unique manner to the transfer device to remove and transfer the pods to load ports between the fabrication sites.

Accordingly, pursuant to the present invention, it is an object to provide a unified system or arrangement for transporting RSPs in a FOUP transport arrangement.

Pursuant to another object of the present invention, there is provided a capability of loading FOUPs in which an automated robot can read RSP and FOUP IDs, load RSPs into the FOUP and then transport the FOUP to another transfer station where the process may be reversed and the RSP delivered as may be required in conformance with specific manufacturing requirements.

A further object of the present invention resides in providing a combined or unified system whereby segregated automation transport loops consisting of a reticle transport and a FOUP transport arrangement are operatively combined through a simple transport container modification.

Another object of the present invention is to provide structure for storing and carrying at least one Reticle Storage Pod (RSP) in an adapted FOUP structure, and whereby there is also provided the capability of simultaneously carrying multiple RSPs in the adaptive FOUP structure.

Still another object of the present invention is to provide a novel structure to handle RSPs in an RFA (Reticle FOUP Adapter Plate) located in a FOUP by providing an adapter modification in the FOUP.

Further means are provided to track the RSP versus rewriting to RFA or FOUP and then resetting after an overhead transport vehicle (OHT) is conveyed to a destination transfer station.

Pursuant to a further object of the invention there is provided an arrangement and a method of handling an RSP versus a FOUP stocker and RFA or a modified FOUP, including an arrangement for utilizing an OHT vehicle or device to, respectively, load and unload an RSP or multiple RSPs into a FOUP.

According to a further object of the invention there is provided an arrangement utilizing a conveyer to load an RSP into and out of a FOUP, and also to locate and secure an RSP via a wafer adapter design for positioning the RSP into a FOUP.

BRIEF DESCRIPTION OF THE SEVERAL VIEWS OF THE DRAWINGS

Reference may now be made to the following detailed description of preferred embodiments of the invention, taken in conjunction with the accompanying drawings; in which.

DETAILED DESCRIPTION

Figure 1:
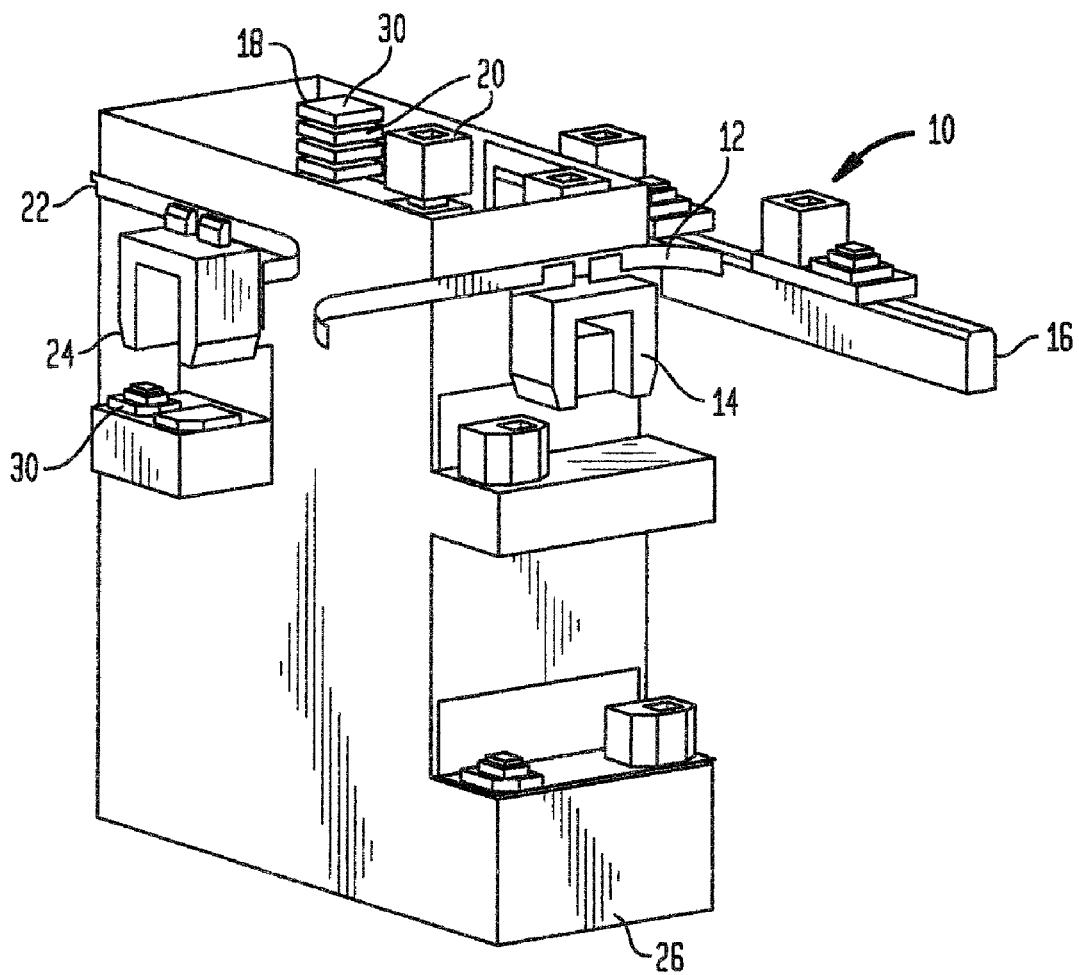
FIG. 1 illustrates a perspective, generally diagrammatic, representation of a reticle to FOUP interface stocker arrangement.

Reverting in particular detail to the invention, and as diagrammatically illustrated in FIG. 1, there is shown a reticle to FOUP interface stocker 10 showing a first conveyor track 12 having a movable FOUP SRC vehicle 14 displaceably arranged thereon; and a LIM (linear induction motor) track system 16 connected to the upper side surface of the reticle to FOUP interface stocker; an RFA (reticle to FOUP adapter) storage 18 is at the top of the stocker 10, which is adapted to be arranged adjacent a FOUP unit 20 and which is adapted to provide for the conveyance of pluralities of stocked reticles to the LIM track system for transference along the transport system.

Illustrated is also a track 22 showing a further vehicle 24 for a reticle SRC and an RSP-to-FOUP-adapter arrangement and which is transportable through a two-way RSP input and output. A manual operator input/output device 26 is provided for, and is for the purpose of receiving the reticle and the FOUP arrangement.

Figure 2:
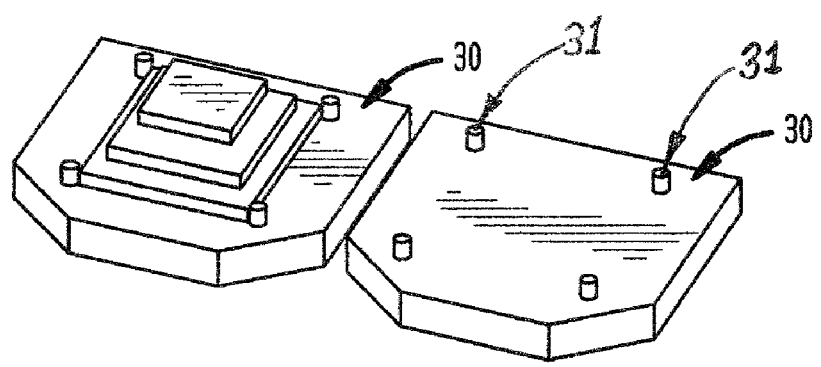
FIG. 2 illustrates a perspective representation of a reticle to FOUP adapter with a Reticle Storage Pod (RSP) arranged thereon and with an empty adapter located adjacent thereto.

As represented in FIG. 2 of the drawings, there is shown an RSP-to-FOUP-adapter (RFA) 30, with a side-by-side view of an adapter 30 having an RSP positioned thereon, and an adjacent empty adapter, wherein this construction of adapter has the same base form 32 as that of a FOUP and is handled from below by the stocker 10 and the LIM track system 16 in a manner analogous to the manipulation of a FOUP.

As shown in FIG. 1, the RSPs are loaded and unloaded via the reticle SRC hoist, and an RFA inventory is maintained in the therewith-dedicated FOUP stocker 10.

The RFA inventory is controlled by means of a suitable RF identifier or tag, and utilized are FOUP and RSP kinematic positioning aspects through the suitable addition of guides, which aid in loading and prevent inadvertent RSP to adapter movement. The positioning is provided for by means of upstanding pins 31 as shown in the adjacent empty adapter of FIG. 2, and the RFAs are capable of accommodating both single RSPs or such multiple "six-pack" reticle pods; which RFAs, if desired, can be loaded at the manual I/O part of the stocker 10.

Figure 3:
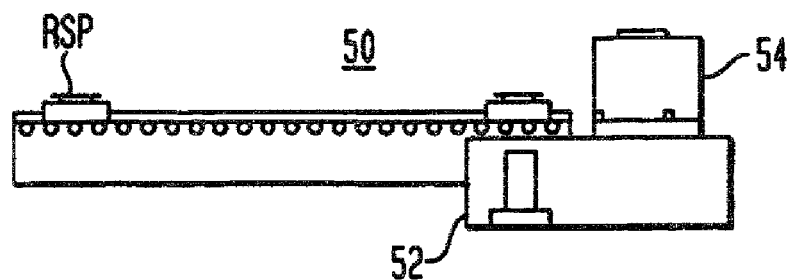
FIG. 3 illustrates, generally diagrammatically, a side view of a Reticle Storage Pod (RSP) located on a RSP and FOUP conveyor structure.

As illustrated in FIG. 3 of the drawings, there is schematically illustrated a segment of a conveyor arrangement 50, which by way of example, may be a reticle roller conveyor, and having a reticle pod, as illustrated in FIG. 2, movably positioned thereon, and connected at one end to a pick-and-place conveyor 52 mounting an RSP FOUP 54.

Figure 4:
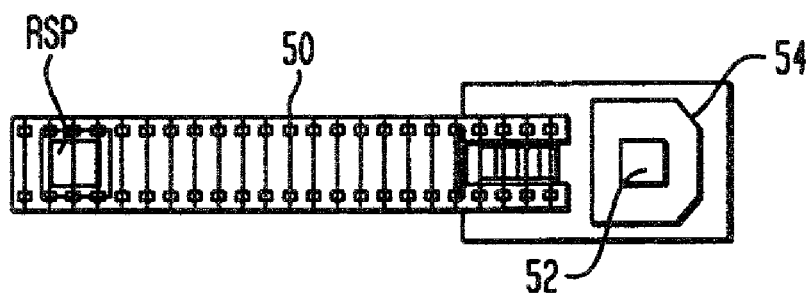
FIG. 4 illustrates a top plan view of the conveyor of FIG. 3.
Figure 5:
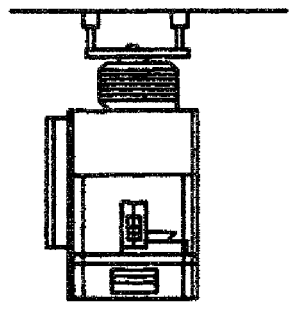
FIG. 5 illustrates a reticle hoist above the conveyor.
Figure 6:
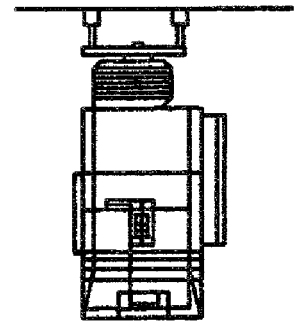
FIG. 6 illustrates a FOUP SRC above the conveyor.
Figure 7A:
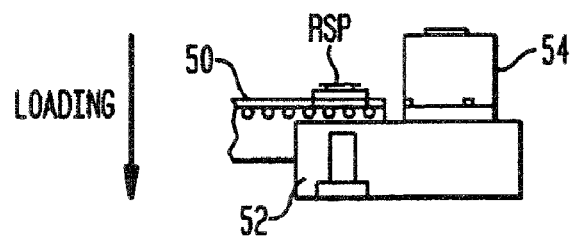
FIGS. 7A through 7E illustrate diagrammatically the sequence of loading and unloading of a Reticle Storage Pod (RSP) employed in connection with the RSP FOUP conveyor.
Figure 7B:
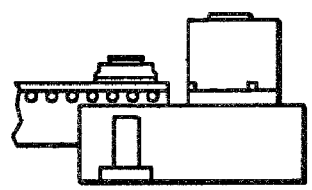
Figure 7C:
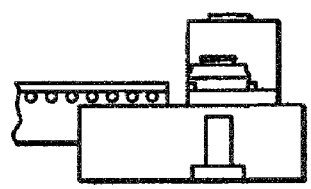
Figure 7D:
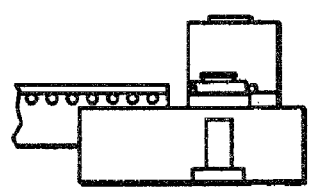
Figure 7E:
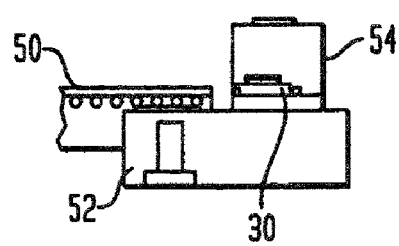
Figure 8:
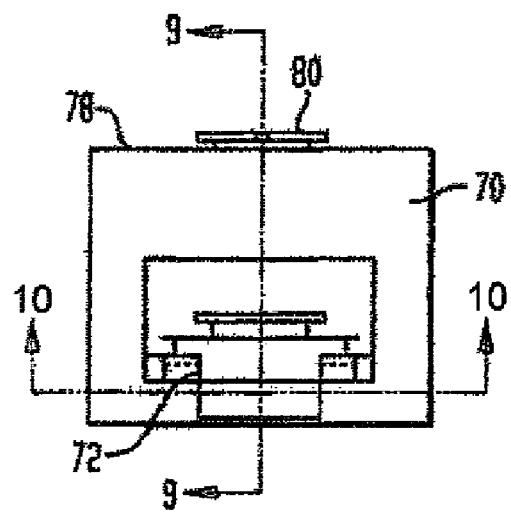
FIG. 8 illustrates diagrammatically an RSP FOUP showing a reticle pod for semiconductor wafers, which are to be arranged therein.
Figure 9:
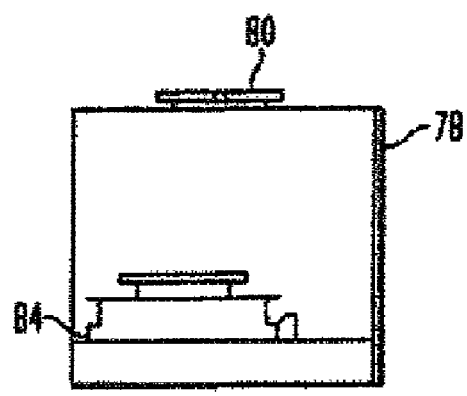
FIG. 9 illustrates a sectional view taken along line 9-9 in FIG. 8.
Figure 10:
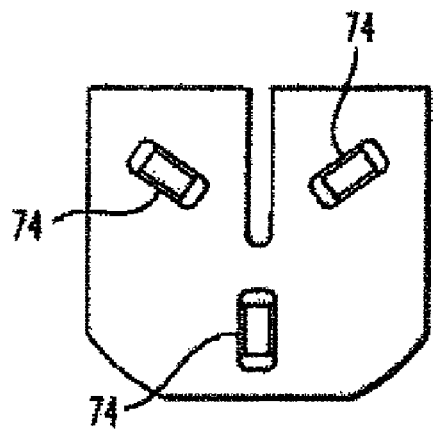
FIG. 10 illustrated a plan view taken along line 10-10 in FIG. 8.
Figure 11:
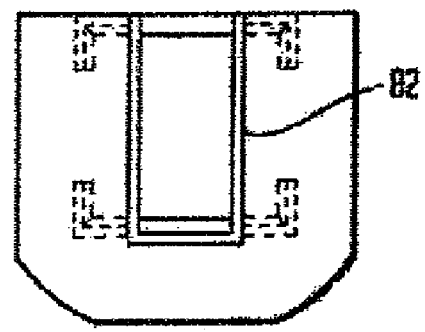
FIG. 11 illustrates a bottom view of the RSP FOUP showing a conveyor table utilized therewith.

The reticle roller conveyer, as also shown in the top plan view of FIG. 4, as well as end views of FIGS. 5 and 6, has the reticle SRC connected thereto for receiving the reticle pods and also the RSP FOUP 54.

As shown in FIGS. 7A through 7E of the drawings, there are illustrated the respective loading and unloading sequences, wherein the reticle is being loaded into the FOUP and then downwardly displaced so as to be adapted to be conveyed to a loading system for further transfer between manufacturing sites. The reverse is also applicable thereto, in effect, the upward movement of empty FOUPs for loading again with RSPs.

As shown in FIGS. 8-11 of the drawings, there is illustrated an RSP FOUP 70 showing an RSP 72 with a three-pin wafer mounting unit 74, and a suitable guide element 84, which is usually employed for the stationary positioning of a 300 millimeter wafer standard FOUP. In this instance, the reticle port is arranged in a FOUP 78 and a flange 80 is provided for adapting the FOUP to SRCs. The bottom of the RSP 72 includes structure for support thereof on a conveyor table 82.

Figure 12:
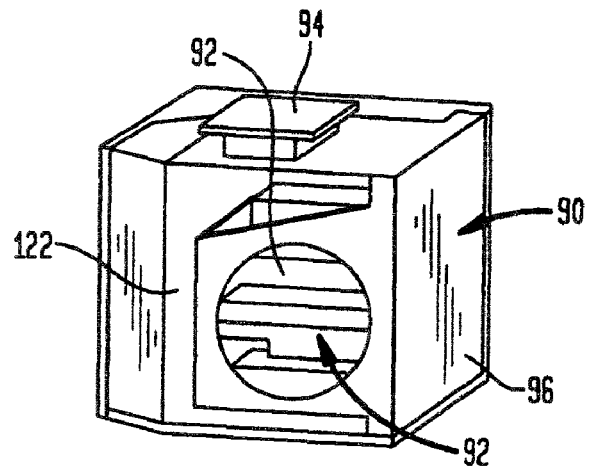
FIGS. 12, 13 and 14 illustrate, generally diagrammatically, a top-loading RSP FOUP structure in, respectively, front, rear and partly-sectional side views.
Figure 13:
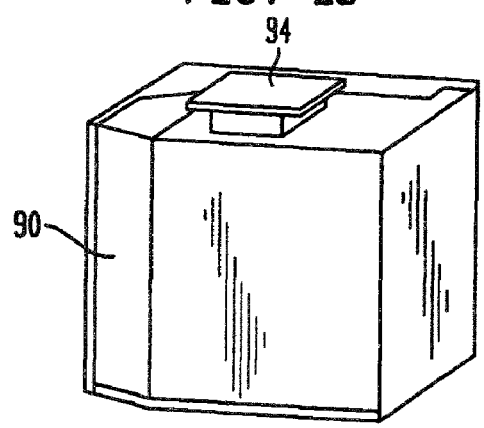
Figure 14:
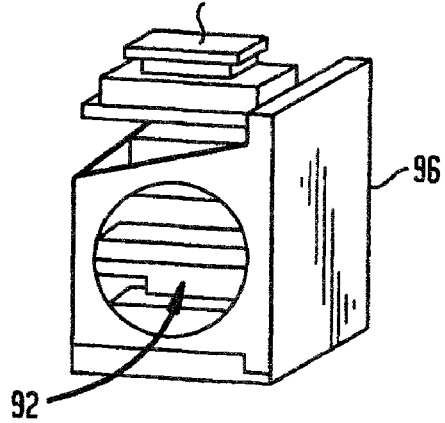

Referring now in specific detail to FIGS. 12-14 of the drawings, illustrated in FIG. 12 is a side view of a closed FOUP 90 showing Reticle Storage Pods (RSPs) 92 for reticles arranged therein in a stacked position. In this instance, as previously indicated, three (3) RSPs, each of which is adapted to support a reticle during the processing or manufacturing steps thereof, are located interiorly of the FOUP, and may be stacked therein utilizing the OHT 100, as illustrated in FIG. 15.

As shown in FIG. 12, the FOUP structure 90 includes a top flange 94 adapted to be supported on an overhead transport track or vehicle (OHT), and wherein the FOUP illustrates a door 96 thereof with the RSP magazine attached thereto.

As illustrated in FIG. 13 of the drawings showing a side view of the FOUP body 90, with the door 96 removed; whereas in FIG. 14 of the drawings, there is illustrated the FOUP door 96 in an open position with the top RSP flange enabling removal of the nested RSPs, which contains reticles.

Figure 15:
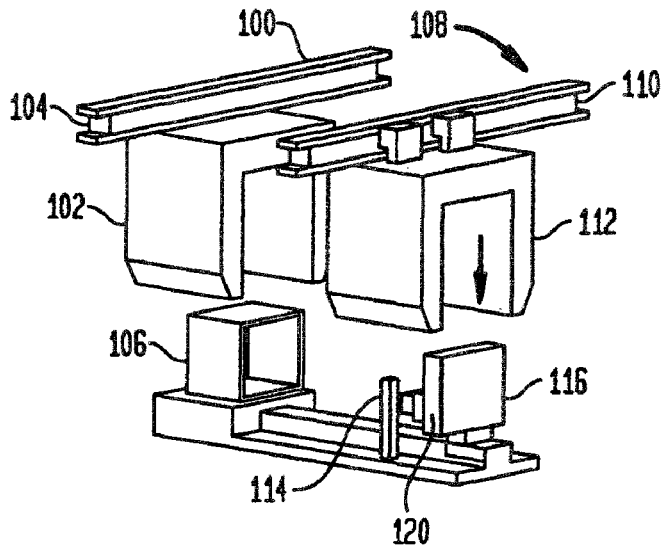
FIGS. 15, 16 and 17 illustrate, respectively, a top-loading RSP FOUP structure in a load sequence.
Figure 16:
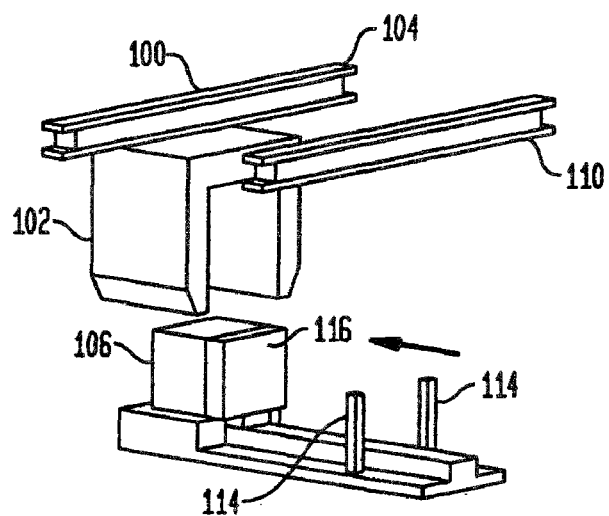
Figure 17:
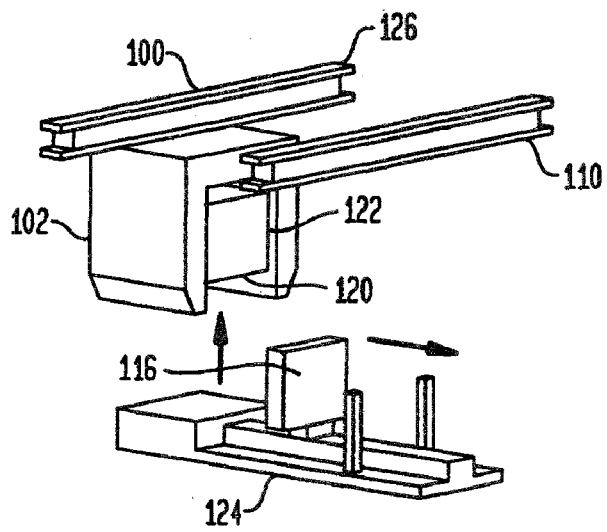

As illustrated in FIGS. 15-17, this discloses the RSP FOUP loading sequence in connection with a top loading construction.

In particular, the FOUP overhead transport 100, as shown in FIG. 15, includes a structure 102, which is supported from an overhead transport rail 104, and which is adapted to engage a FOUP 106, the latter of which may contain RSPs in a stacked or superimposed nested position.

In the aspect of loading the RSPs with the RSP overhead transport (RSP OHT) 108, a further rail 110 has the RSP transport unit 112 arranged thereon and which may be vertically displaceable, and which, as shown in FIG. 15, is adapted to load reticles into the opened portion or door of the FOUP 106. In this connection, a suitable sensor or sensors 114 may be provided for detecting the RSPs, which are deposited into the open door portion 120 of the FOUP 106, which is opened using the door opener mechanism 116, such as shown in FIG. 14 of the drawings, as previously referred to.

Upon the RSPs having been loaded through the open portion of the FOUP, the RSP FOUP door 120 is closed, as illustrated in FIG. 16, so as to provide a closed top loaded RSP FOUP 122, as shown, for example, in FIG. 12 of the drawings, by being moved along a track portion 124 in a horizontal manner. Thereafter, the RSP FOUP 122 is lifted upwardly into the transport unit 126 for the RSP FOUP, for transporting the loaded RSP FOUP 122 to a further site for manufacture or processing, as described hereinbelow.

Figure 18:
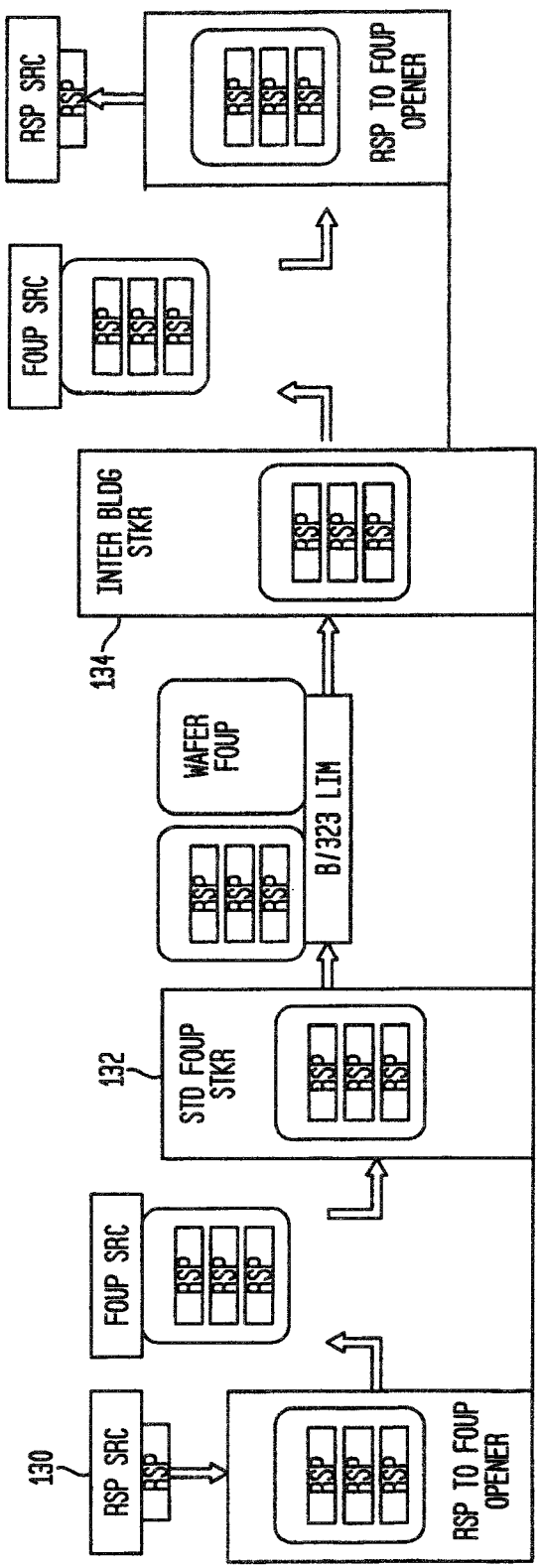
FIG. 18 illustrates a schematic representation of the RSP FOUP transport system extending between a first location to a further location along the route of conveyance of the combined reticle and FOUP RSP transport system.

Referring to FIG. 18 of the drawings, there is illustrated a schematic representation of the transport of an RSP FOUP 122 between a different manufacturing or processing sites for semiconductor wafers or similar components of integrated circuits or microprocessor devices.

As shown in the drawing, the RSP SRC 130 deposits the RSPs in the RSP FOUP transport conveyor, as provided for in FIGS. 15-17 of the drawings.

Thereafter, the FOUP SRCs and the RSP are transported into a standard FOUP stocker 132, which also combines the RSP and the wafer FOUP for further transport into an inter-building stocker 134, whereupon the RSPs are then forwarded to a FOUP structure and the RSP and the RSP interconnections are then removed from the FOUP conveyor at that further location, which may be at a manufacturing annex or further processing site.

The entire transport procedure with the empty FOUPs may then be returned to the initial locale or site so as to be able to again repeat the foregoing loading and transport procedure.

From the foregoing, it is clearly evident that due to the combination and the use of an adapter, which correlates and combines the RSP with FOUP conveyor or transport systems, these separate transport arrangements can be combined to present a single straightforward solution at minimum cost and equipment modifications, and is adapted to increase LIM capacity so as to also meet RFA quantity requirements.

The RSP is protected in a FOUP-like container, which permits handling and transport by means of the top flange, as shown in FIGS. 8-11 of the drawings, and an existing vertical motion capability of FOUP and RSP overhead transport is employed to load and unload the RSPs, as shown in FIG. 3 of the drawings.

The provision of the unique FOUP opening system enables positioning the RSP FOUP for loading and is adapted to be employed for factory floor level automated OHT RSP loadings; factory floor level manual RSP loading or sealing level automated OHT RSP loading.

The structure, as shown, is clearly adapted to enable the loading and unloading in an option of the Reticle Storage Pods in the FOUP shown with the door with RSP magazine attached and with the FOUP opened and the top OHT flange.

As indicated, the FOUP overhead transport track enables the FOUP OUT vehicle to engage the RSP FOUP and the FOUP door opener by means of the through-beam RSP sensors.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

The invention claimed is:

1. An arrangement for combining a front opening unified pod (FOUP) system and a reticle system for the transport of semiconductor wafers between processing sites, comprising:
   structure modifying a FOUP so as to facilitate said FOUP transporting at least one reticle carrying a semiconductor wafer between a plurality of processing sites;
   an adapter for said at least one reticle configured to act directly on said at least one reticle, said adapter facilitating insertion and transport of said at least one reticle in said FOUP; and said adapter comprises a plate member insertable into said FOUP, said plate member includes upstanding kinematic guide pins arrayed to maintain wafers in predetermined positions on said at least one reticle during transport in said FOUP.

2. An arrangement as claimed in claim 1, wherein said FOUP includes structure for carrying up to at least three said reticles in a superimposed stacked position during transport of said reticles between said sites, and wherein said structure comprises a portion of a FOUP door assembly.

3. An arrangement as claimed in claim 2, wherein an interface stocker system is provided for the transport of reticles in Reticle Storage Pods (RSPs) to said FOUP adapter, said stocker system including a reticle to FOUP adapter (RFA) storage for supplying reticles to said FOUP.

4. An arrangement as claimed in claim 3, wherein overhead transport structure (OHT) is provided for positioning said FOUP; a further overhead transport structure (RSP OHT) is provided for positioning said Reticle Storage Pods (RSPs) proximate said FOUPs; structure for introducing said Reticle Storage Pods into said FOUPs and closing said FOUPs; and conveying structure for transporting the Reticle Storage Pod-containing FOUPs (RSP FOUPs) to a specified manufacturing or processing site.

5. An arrangement as claimed in claim 4, wherein sensors provide information and control for the loading and unloading of said Reticle Storage Pods (RSPs) into and from said front opening unified pods (FOUPs).

6. A system for transporting and tracking Reticle Storage Pods (RSPs) in Reticle Storage Pod—FOUPs (RSP FOUPs), between sites, comprising:
  an arrangement for tracking RSPs via RF pill rewriting to a reticle FOUP adapter (RFA) or FOUP RF pill and resetting thereof after transport from an overhead transport vehicle (OHV) at a destination transfer site, whereby said RSP is removed from the RFA in said FOUP;
  a conveyor arrangement transports said RSP FOUPs between said manufacturing sites, and reconveyed emptied FOUPs to an initial said site for reloading thereof with Reticle Storage Pods carrying semiconductor wafers;
  a structure is provided for transporting a six-pack of said reticles in a FOUP;
  wherein each said FOUP incorporates reticle adapter structure configured to act directly on said reticles to facilitate transport of said Reticle Storage Pods in said FOUPs in a combined operative transport mode;
  said reticle adapter structure comprises a plate member insertable into said FOUP, said plate member includes upstanding kinematic guide pins arrayed to maintain wafers in predetermined positions on each of said reticles during transport in said FOUP.

7. A method of combining a front opening unified pod (FOUP) system and a reticle system for the transport of semiconductor wafers between processing sites, said method comprising:
  modifying said FOUP so as to facilitate said FOUP transporting at least one reticle carrying a semiconductor wafer between said sites;
  providing an adapter for said at least one reticle configured to act directly on said at least one reticle;
  facilitating insertion and transport of said at least one reticle in said FOUP using said adapter;
  providing a plate member which is insertable into said FOUP, said plate member being part of said adapter; and
  arraying upstanding guide pins on said plate member to maintain wafers in predetermined positions on said at least one reticle during transport in said FOUP.

8. A method as claimed in claim 7, wherein said FOUP carries at least three said reticles in a superimposed stacked position during transport of said reticles between said sites.

9. A method as claimed in claim 7, wherein an interface stocker system is provided for the transport of reticles in Reticle Storage Pods (RSPs) to said FOUP adapter, said stocker system including a reticle to FOUP adapter (RFA) storage for supplying reticles to said FOUP.

10. A method as claimed in claim 9, wherein overhead transport structure (OHT) is provided for positioning said FOUP; a further overhead transport structure (RSP OHT) is provided for positioning said Reticle Storage Pods (RSPs) proximate said FOUPs; structure for introducing said Reticle Storage Pods into said FOUPs and closing said FOUPs; and conveying structure for transporting the Reticle Storage Pod-containing FOUPs (RSP FOUPs) to a specified manufacturing or processing site.

11. A method as claimed in claim 10, wherein sensors provide information and control for the loading and unloading of said Reticle Storage Pods (RSPs) into and from said front opening unified pods (FOUPs).

12. A method of transporting and tracking Reticle Storage Pods (RSPs) in Reticle Storage Pod—FOUPs (RSP FOUPs), between sites, comprising:
  tracking RSPs via RF pill rewriting to a reticle FOUP adapter (RFA) or FOUP RF pill and resetting thereof after transport from an overhead transport vehicle (OHV) at a destination transfer site, whereby said RSP is removed from the RFA in said FOUP;
  transporting said RSP FOUPs between said manufacturing sites using a conveyor arrangement, and reconveying emptied FOUPs to an initial said site for reloading thereof with Reticle Storage Pods carrying semiconductor wafers;
  transporting a six-pack of said reticles in a FOUP using structure;
  facilitating transport of said reticle storage pods in said FOUPs in a combined operative transport mode wherein said FOUPs incorporate reticle adapter structure configured to act directly on said reticles;
  providing a plate member which is insertable into said FOUP, said plate member being part of said reticle FOUP adapter; and
  arraying upstanding guide pins on said plate member to maintain wafers in redetermined positions on said reticles during transport in said FOUP.

* * * * *